United States Patent [19]
Mermet-Guyennet

[11] Patent Number: 4,909,428
[45] Date of Patent: Mar. 20, 1990

[54] FURNACE TO SOLDER INTEGRATED CIRCUIT CHIPS

[75] Inventor: Michel Mermet-Guyennet, St. Egreve, France

[73] Assignee: Thomson Composants Militaires et Spatiaux, Paris, France

[21] Appl. No.: 223,001

[22] Filed: Jul. 22, 1988

[30] Foreign Application Priority Data

Jul. 24, 1987 [FR] France .................................. 87 10572

[51] Int. Cl.$^4$ ........................ B23K 26/00; B23K 26/02
[52] U.S. Cl. ...................................... 228/6.2; 228/45; 228/179; 228/191; 219/121.65
[58] Field of Search ............ 228/191, 264, 179, 180.2, 228/6.2, 123, 45; 218/85 BA, 121.65, 121.63

[56] References Cited

U.S. PATENT DOCUMENTS

| | | | |
|---|---|---|---|
| 3,387,365 | 6/1968 | Stelmak | 228/180.2 |
| 3,617,682 | 11/1971 | Hall | 228/180.2 |
| 3,717,742 | 2/1973 | Fottler | 228/180.2 |
| 3,742,181 | 6/1973 | Costello | 219/85 |
| 3,887,997 | 6/1975 | Hartleroad et al. | 228/180.2 |
| 4,160,893 | 7/1979 | Meyen et al. | 228/6.2 |
| 4,278,867 | 7/1981 | Tan | 219/85 BA |
| 4,634,043 | 1/1987 | Avedissian | 228/180.2 |

FOREIGN PATENT DOCUMENTS

| | | |
|---|---|---|
| 0013345 | 7/1980 | European Pat. Off. . |
| 0109892 | 5/1984 | European Pat. Off. . |
| 2360308 | 6/1974 | Fed. Rep. of Germany . |
| 74147 | 6/1980 | Japan .............................. 228/180.2 |

OTHER PUBLICATIONS

IBM Technical Disclosure Bulletin, "Simultaneous Laser-Assisted Solder Reflow . . . ", vol. 31, No. 6, pp. 7–9, Nov. 1988.
IBM Technical Disclosure Bulletin, vol. 16, No. 4, Sep. 1973, p. 1154, New York, U.S.; DeBoskey et al., "Accurate Chip Placement On A Substrate."
Patent Abstracts of Japan, vol. 10, No. 368 (M-543) [2425], Dec. 9, 1986; & JP-A-61 162 292 (Yutaka Kaneda) 22-07-1986.

Primary Examiner—Nicholas P. Godici
Attorney, Agent, or Firm—Oblon, Spivak, McClelland, Maier & Neustadt

[57] ABSTRACT

A furnace for soldering integrated circuit chips on a ceramic substrate has a heating plate supporting the substrate, the plate comprising perforations at the places where the integrated circuit chips will be soldered, behind the plate, a heat radiation source and a device to direct the radiation as desired towards only one of the apertures of the plate at a time.

5 Claims, 2 Drawing Sheets

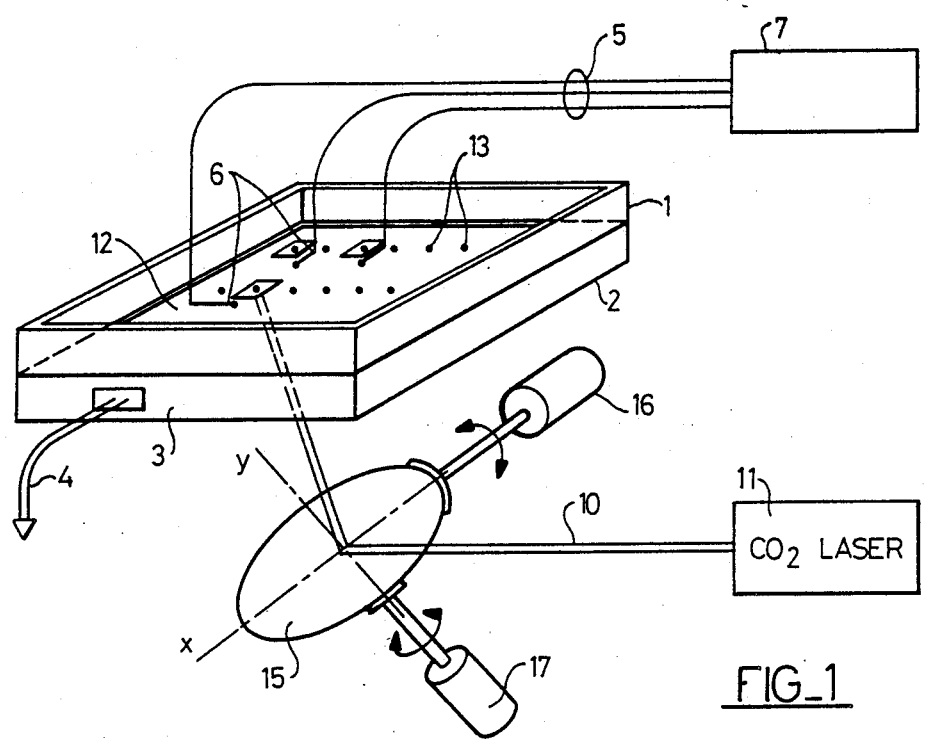
FIG_1
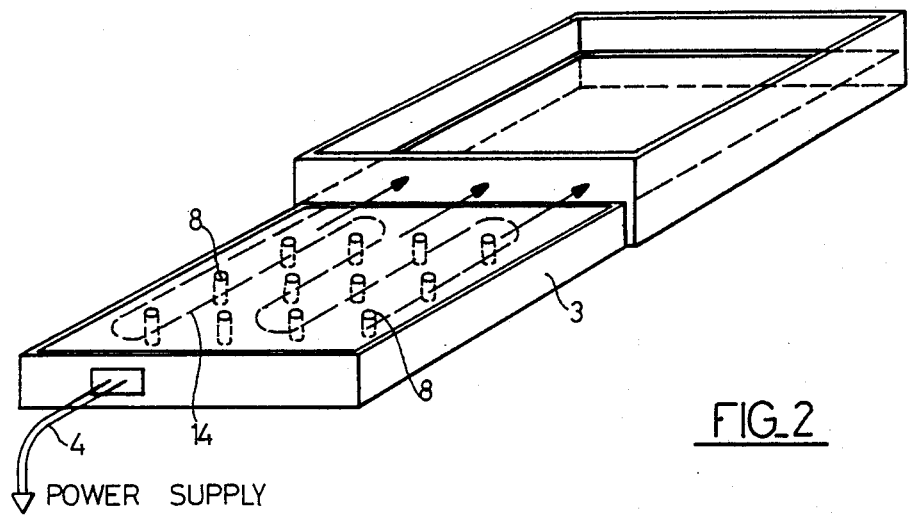
FIG_2

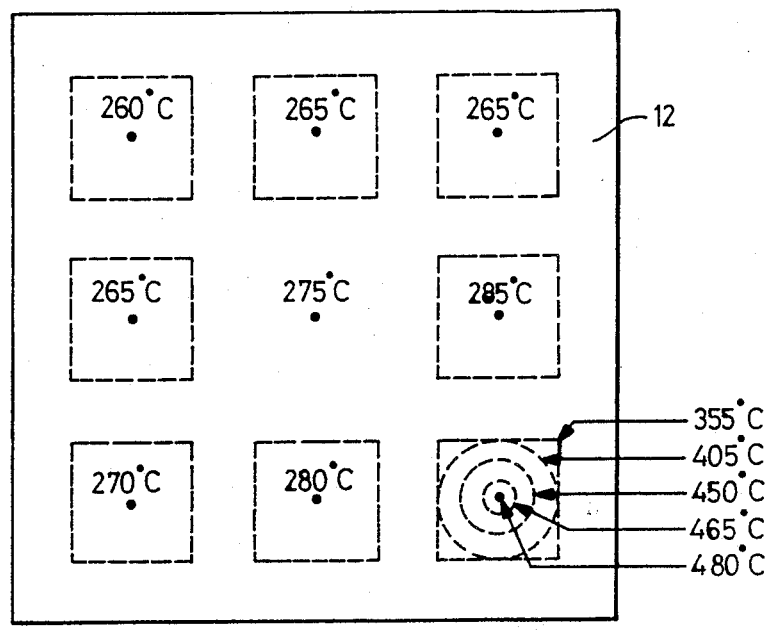
FIG_3

FURNACE TO SOLDER INTEGRATED CIRCUIT CHIPS

BACKGROUND OF THE INVENTION

1. Field of the Invention

The invention concerns a furnace to solder integrated circuit chips. More particularly, it concerns a furnace used to solder chips to a hybrid circuit ceramic substrate.

2. Description of the Prior Art

Until now, integrated circuit chips have been soldered only in their packages. For this purpose, the package is placed in a furnace comprising heating resistors. A eutectic preform is placed in the package at the place where the chip has to e soldered. The temperature of the furnace is made to rise until the preform reaches melting temperature. The integrated circuit chip is placed in the package and the heating is stopped. In cooling down, the preform enables the chip to be fixed mechanically to the package. To remove the chip from the package, the same operation is performed to take the preform to its melting temperature.

Hybrid circuits are having to be increasingly used. These hybrid circuits consist of a set of integrated circuits and other components arranged on a single substrate. The chips are usually bonded to the substrate. Now, the technique which consists in bonding the chips is not reliable in the long run. Furthermore, the bonder does not provide for efficient heat dissipation. However, it is impossible to use the technique of eutectic soldering for hybrid circuits because the existing equipment cannot be used, on the one hand, to receive circuits of this type and, on the other hand, to solder all the parts at the same time. Now, if the chips are soldered one after the other, the already positioned preforms reach their melting temperature and the chips get detached as and when they are positioned. Nor is it possible to unsolder any defective chip without disturbing all the other chips.

However, there is a soft soldering technique entailing a passage through a conveyor-fitted furnace. However, the wettability is too poor and is therefore not suitable and, furthermore, the positioning that can be obtained for the circuits is very inadequate.

The present invention makes it possible to cope with all these problems by proposing a furnace comprising a heating frame and a device for the localized supply of heat, this assembly being used to older chips one after another without disturbing already soldered chips.

SUMMARY OF THE INVENTION

More particularly, an object of the present invention is a furnace for the soldering of integrated circuit chips to a ceramic substrate, comprising a heating plate supporting the substrate, said plate comprising perforations at the places where the integrated chips will be soldered, said furnace comprising, behind the plate, a source of heat radiation and means to guide the radiation, as desired, to only one of the holes of the plate at a time.

BRIEF DESCRIPTION OF THE DRAWINGS

The invention will be better understood from the following description given as a non-restrictive example, with respect to the appended drawings, of which:

FIG. 1 shows a soldering furnace according to the invention;

FIG. 2 shows the detail of the frame and the heating plate of the furnace according to the invention;

FIG. 3 is a mapping of the temperatures of a substrate according to the invention.

DESCRIPTION OF A PREFERRED EMBODIMENT

FIG. 1 is a schematic drawing of a furnace according to the invention. The furnace has a frame 1 which has a heating plate 3, which is preferably detachable in the bottom 2. This plate encloses heating resistors 14, seen in FIG. 2, which are electrically connected to a main supply by a wire 4 connected to the plate. A second wire 5, connected to the frame of the furnace is used to connect thermocouples 6 electrically to an electronic control circuit 7 to control the setting of the heating by the resistors. As shown in FIG. 2, the plate 3 of the bottom of the furnace has been perforated so that it comprises a specified number of small-diameter apertures 8, calibrated to let through radiation from a heat source placed behind this plate. This radiation can be produced by a laser beam 10, the diameter of which has been chosen to be about 4 mm., by way of example, for the feasibility study. The laser beam 10 is obtained from a laser source 11. In fact, the thickness of the beam can be adapted to the substrate by using the divergence of the laser. Furthermore, the distribution of energy in the beam is chosen from the radiation modes (TEM 00, TEM 01, . . . , Multimode etc.). The number of apertures corresponds to the number of chips which have to be soldered to the substrate. For a given number of chips, the corresponding plate will be used. This corresponding plate will comprise the desired number of apertures and its positioning will correspond to that of the chips on the substrate.

The substrate 12 is placed in the furnace on the heating plate 3 and is secured so that the location reserved for the chips is facing the apertures of the plate. The substrate 12 also has one or more small apertures 13 at the locations where the preform pellets are soldered. These apertures let through a spike, when any repairs have to be made, to remove the pellet with the chip. The size of the apertures should be sufficient to let through a spike, but small enough so that they do not generate an excessively high gradient of stresses in the silicon after soldering.

When the chips are soldered to the substrate, eutectic preforms are positioned. These eutectic preforms are in the form of pellets consisting, for example, of a gold-/silicon alloy, a gold/germanium alloy or any other suitable alloy. Then a preliminary heating is done by means of the resistors 14 so that the temperature on the substrate gets stabilized at pre-determined temperature corresponding to a regulation temperature. When this temperate is reached, the laser beam 10 is oriented so that its radiation comes beneath the furnace plate and reaches the desired aperture of this plate to raise the temperature of the substrate locally. Thus, the temperature of the preform, which is placed above the substrate also increases until it reaches the eutectic temperature. When the eutectic temperature is reached, the preform melts, the chip is placed on top of the melted preform and the emission of the laser beam is stopped. In cooling down, the preform hardens and fixes the chip mechanically to the substrate. This operation is started again for each chip to be soldered to the substrate.

To provide heat locally, in this example, a carbon dioxide laser device 11 is used. This laser device 11 emits continuous radiation with a power of 15 W for example. The energy of the laser may, of course, be adjusted according to the pellet to be soldered and the absorption capacity of the substrate at the wavelength considered. Instead of laser radiation, it is also possible to use a Xenon type lamp, a stream of hot gas or any other means for conveying calorific energy by radiation or convection.

To orient the laser beam towards a given opening of the plate, a reflecting mirror 15 is used, tilted at an angle such that the reflected beam is located exactly beneath this opening.

Of course, this mirror can be controlled mechanically to obtain a tilt around an axis X and a tilt around an axis Y so as to give the beam the desired X and Y coordinates.

In order to obtain the desired position of the beam, the mirror is solidly joined, for example, to a shaft along the axis X, coupled to a small motor 16, and to a shaft along the axis Y coupled to another small motor 17.

According to a preferred embodiment, the mirror can be fixed with respect to a reference, the furnace then being movable above the mirror with respect to this reference. The positioning of the furnace is consequently obtained by shifts along two orthogonal axes. These shifts can be done by adapted prior art mechanisms existing in this field. This approach can be well suited to automation for, in this case, the system for picking up and ringing the chip and the preform can be solidly joined to the furnace as also the system for ejecting the preform pellets along with the chips by means of spikes.

A furnace of this type can be used to solder several integrated circuit chips to a substrate, one after another, without disturbing the chips already placed on the substrate.

The furnace can also be used, when necessary, to detach a chip from the substrate without disturbing any of the others. To do this, the substrate with the integrated circuits is again placed in the furnace to carry this substrate to the regulation temperature of 200° C. by putting the resistors of the furnace into operation. Then, the mirror or the furnace is positioned so that the laser beam is under that aperture of the furnace plate which is beneath the chip to be removed. The laser device is put into operation and the preform placed between the chip and the substrate undergoes an increase in temperature. When the temperature reaches the eutectic temperature, it suffices to grasp the chip or lift it in order to remove it. For example, the chip can be lifted with a spike by slipping this spike into the apertures of the plate and the substrate: the small-diameter apertures 13 made in the substrate are provided for this purpose.

The gold-germanium alloy or other alloys adapted to this function can undergo several meltings without any degradation in their wettability on the rear face of the integrated circuits which are in contact with the preform.

The substrate is, for example, an alumina or aluminium nitride substrate which is well suited to localized heating by $CO_2$ laser.

FIG. 3 shows an example of a result obtained for a two-inch (50.8 mm×50.8 mm) alumina substrate 12, a 15 W power laser, a 4 mm diameter of the beam under the substrate and a regulation temperature of 260° C. The temperature of the substrate in the central region goes up to 480° C., this temperature being higher than the eutectic temperature.

This temperature diminishes with distance from the point of impact of the beam until it reaches a value of 355° C. corresponding to a temperature which is slightly greater than or equal to the eutectic temperature.

The temperature of the other zones of the substrate on which the chips are placed does not exceed 285° C., which is appreciably below the eutectic temperature.

What is claimed is:

1. A furnace for the soldering of a plurality of integrated circuit chips to a ceramic substrate comprising, a heating plate supporting the substrate, said plate comprising multiple perforations located at the places where the integrated chips will be soldered, and further comprising, below the plate, a source of heat radiation and means to selectively direct the radiation to only one of the perforations of the plate at a time, whereby said heating plate masks said laser beam from said substrate except at the location of said plural circuit chips.

2. A soldering furnace according to claim 1 wherein the radiation source consists of a carbon dioxide laser and the means to direct the radiation consist of a reflecting mirror.

3. A soldering furnace according to claim 1 or 2 wherein the substrate placed on the heating plate has perforations facing the perforations of the plate to enable a spike to pass through in order to lift a chip to be unsoldered.

4. A soldering furnace according to claim 2 wherein the furnace is fixed with respect to a reference and wherein the mirror is movable with respect to this reference.

5. A soldering furnace according to claim 2 wherein the mirror is fixed with respect to a reference and wherein the furnace is movable with respect to this reference.

* * * * *